United States Patent [19]
Tran et al.

[11] Patent Number: 6,030,891
[45] Date of Patent: Feb. 29, 2000

[54] VACUUM BAKED HSQ GAP FILL LAYER FOR HIGH INTEGRITY BORDERLESS VIAS

[75] Inventors: Khanh Tran, San Jose; Richard J. Huang, Cupertino; Guarionex Morales, Santa Clara, all of Calif.

[73] Assignee: Advanced Micro Devices, Inc., Sunnyvale, Calif.

[21] Appl. No.: 08/993,052

[22] Filed: Dec. 18, 1997

[51] Int. Cl.$^7$ ............................................. H01L 21/4763
[52] U.S. Cl. ..................... 438/623; 438/624; 438/622; 438/626; 438/631; 438/637; 438/958
[58] Field of Search ................... 438/623, 624, 438/622, 626, 631, 637, 958

[56] References Cited

U.S. PATENT DOCUMENTS

| | | | |
|---|---|---|---|
| 5,219,788 | 6/1993 | Abernathey et al. | 437/187 |
| 5,506,177 | 4/1996 | Kishimoto et al. | 437/195 |
| 5,567,660 | 10/1996 | Chen et al. | 437/231 |
| 5,643,407 | 7/1997 | Chang | 156/644.1 |
| 5,728,630 | 3/1998 | Nishimura et al. | 438/763 |
| 5,750,403 | 5/1998 | Inoue et al. | 438/787 |

OTHER PUBLICATIONS

A. J. Konecni et al., "A Stable Plasma Treated CVD Titanium Nitride Film for Barrier/Glue Layer Applications," VMIC Conference, Jun. 18–20, 1996, 1996 ISMIC–106/96/0181(c), pp. 181–183.

Kim et al., "Stability of TiN Films Prepared by Chemical Vapor Deposition Using Tetrakisdimethylamino Titanium," Electrochem. Soc., vol. 143, No. 9, Sep. 1996, pp. L188–L190.

Iacoponi et al., "Resistivity Enhancement of CVD TiN With In–Situ Nitrogen Plasma and Its Application in Low Resistance Multilevel Interconnects," Advanced Metalization and Interconnect Systems for ULSI, 1995, (5 pages).

Eizenberg et al., "Chemical vapor deposited TiCN: A new barrier metallization for submicron via and contact applications," J. Vac. Sci. Technol. A, vol. 13, No. 3, May/Jun. 1995, pp. 590–595.

Eizenberg et al., "TiCN: A new chemical vapor deposited contact barrier metallization for submicron devices," (3 pages).

Hillman et al., "Comparison of Titanium Nitride Barrier Layers Produced by Inorganic and Organic CVD," Jun. 9–10, 1992, VMIC Conference, 1992, ISMIC–101/92/0246, pp. 246–252.

Liu et al., "Integrated HDP Technology for Sub–0.25 Micron Gap Fill," Jun. 10–12, 1997, VMIC Conference, 1997, ISMIC–107/97/0618(c), pp. 618–619.

Bothra et al., "Integration of 0.25 $\mu$m Three and Five Level Interconnect System for High Performance ASIC," Jun. 10–12, 1997, VMIC Conference, 1997, ISMIC–107/97/0043, pp. 43–48.

Wang et al., "Process Window Characterization of ULTIMA HDP–CVD™ USG Film," Feb. 10–11, 1997, DUMIC Conference 1997 ISMIC–222D/97/0405, pp. 405–408, 619.

Saikawa et al., "High Density Plasma CVD for 0.3 $\mu$m Device Application," Jun. 18–20, 1996, VMIC Conference 1996 ISMIC–106/96/0069(c), pp. 69–75.

Nguyen et al., "Characterization of High Density Plasma Deposited Silicon Oxide Dielectric for 0.25 Micron ULSI," Jun. 27–29, 1995, VMIC Conference 1995 ISMIC–104/95/0069, pp. 69–74.

*Primary Examiner*—John F. Niebling
*Assistant Examiner*—David A. Zarneke

[57] ABSTRACT

Borderless vias are formed in electrical connection with a lower metal feature of a metal patterned later gap filled with HSQ. Vacuum baking is conducted before filling the through-hole to outgas water absorbed during solvent cleaning, thereby reducing void formation and improving via integrity. Embodiments include vacuum baking at a temperature of about 300° C. to about 400° C., for about 45 seconds to about 2 minutes, at a pressure of no greater than about $10^{-6}$ Torr, preferably in the same tool employed for depositing the barrier layer in filling the through-hole.

27 Claims, 3 Drawing Sheets

VACUUM BAKED HSQ GAP FILL LAYER FOR HIGH INTEGRITY BORDERLESS VIAS

TECHNICAL FIELD

The present invention relates to high density, multi-metal layer semiconductor device with reliable interconnection patterns. The invention has particular applicability in manufacturing ultra large scale integration multi-metal layer semiconductor devices with design features of 0.25 microns and under.

BACKGROUND ART

The escalating demands for high densification and performance associated with ultra large scale integration semiconductor devices require design features of 0.25 microns and under, such as 0.18 microns, increased transistor and circuit speeds, high reliability and increased manufacturing throughput. The reduction of design features to 0.25 microns and under challenges the limitations of conventional interconnection technology, including conventional photolithographic, etching and deposition techniques.

Conventional methodology for forming patterned metal layers comprises a subtractive etching or etch back step as the primary metal patterning technique. Such a method involves the formation of a first dielectric layer on a semiconductor substrate, typically monocrystalline silicon, with conductive contacts formed therein for electrical connection with an active region on the semiconductor substrate, such as a source/drain region. A metal layer, such as aluminum or an aluminum alloy, is deposited on the first dielectric layer, and a photoresist mask is formed on the metal layer having a pattern corresponding to a desired conductive pattern. The metal layer is then etched through the photoresist mask to form the conductive pattern comprising metal features separated by gaps, such as a plurality of metal lines with interwiring spacings therebetween. A dielectric layer is then applied to the resulting conductive pattern to fill in the gaps and the surface is planarized, as by conventional etching or chemical-mechanical polishing (CMP) planarization techniques.

As shown in FIGS. 1 and 2, conventional practices comprise depositing metal layer 11 on dielectric layer 10 which is typically formed on a semiconductor substrate containing an active region with transistors (not shown) After photolithography, etching is conducted to form a patterned metal layer comprising metal features 11a, 11b, 11c and 11d with gaps therebetween. A dielectric material 12, such as spin on glass (SOG), is typically deposited to fill in the gaps between the metal features, and baked at a temperature of about 300+ C. to about 350° C., and then cured in a verticle furnace at about 350° C. to about 400° C. for a period of time up to about one hour, depending upon the particular SOG material employed, to effect planarization. Another oxide is deposited by plasma enhanced chemical vapor deposition (PECVD) and then planarization is then performed, as by CMP.

As feature sizes, e.g., metal lines and interwiring spacings, shrink to 0.2 microns and below, it becomes increasingly difficult to satisfactorily fill in the interwiring spacings voidlessly and obtain adequate step coverage. It also becomes increasingly difficult to form a reliable interconnection structure. A spin on dielectric material for gap filling appears to be the only viable solution. A through-hole is then formed in a dielectric layer to expose an underlying metal feature, wherein the metal feature serves as a landing pad occupying the entire bottom of the through-hole. Upon filling the through-hole with conductive material, such as a metal plug to form a conductive via, the entire bottom surface of the conductive via is in direct contact with the metal feature. Such a conventional technique is illustrated in FIG. 3, wherein metal feature 30 of a first patterned metal layer is formed on first dielectric layer 31 and exposed by through-hole 32 formed in second dielectric layer 33. In accordance with conventional practices, through-hole 32 is formed so that metal feature 30 encloses the entire bottom opening, thereby serving as a landing pad for metal plug 34 which fills through-hole 32 to form conductive via 35. Thus, the entire bottom surface of conductive via 35 is in direct contact with metal feature 30. Conductive via 35 electrically connects metal feature 30 and metal feature 36 which is part of a second patterned metal layer. As shown in FIGS. 2 and 3, the side edges of a metal feature or conductive line, e.g., 30A, 30B, and 36A, and 36B, taper somewhat as a result of etching.

The reduction of design features to the range of 0.25 microns and under requires extremely high densification. The conventional practice of forming a landing pad completely enclosing the bottom surface of a conductive via utilizes a significant amount of precious real estate on a semiconductor chip which is antithetic to escalating high densification requirements. In addition, it is extremely difficult to voidlessly fill through-holes having such reduced dimensions because of the extremely high aspect ratio, i.e., height of the through-hole with respect to diameter of the through-hole. Accordingly, conventional remedial techniques comprise purposely widening the diameter of the through-hole to decrease the aspect ratio. As a result, misalignment occurs wherein the bottom surface of the conductive via is not completely enclosed by the underlying metal feature. This type of via is called a "borderless via", which also conserves chip real estate.

The use of borderless vias, however, creates new problems. For example, as a result of misalignment, the SOG gap filling layer is penetrated by etching when forming a misaligned through-hole, due to the low density and poor stability of SOG. As a result of such penetration, moisture and gas accumulate thereby increasing the resistance of the interconnection. Moreover, spiking can occur, i.e., penetration of the metal plug to the substrate causing a short. Adverting to FIG. 4, first dielectric layer 41 is formed on substrate 40 and a first metal pattern comprising a first metal feature, e.g., metal line 45, comprising anti-reflective coating 45A, is formed on first dielectric layer 41 gap filled with SOG 42. Dielectric layer 43 is then deposited and a misaligned through-hole formed therein exposing a portion of the upper surface and at least a portion of a side surface of metal line 45, and penetrating into and exposing a portion of SOG layer 42. Upon filling the through-hole with a metallic plug 44, typically comprising an initial barrier layer (not shown) and tungsten, spiking occurs, i.e., penetration through to substrate 40, thereby causing shorting.

Hydrogen silsesquioxane (HSQ) offers many advantages for use in interconnect patterns. HSQ is relatively carbon free, thereby avoiding poison via problems. Moreover, due to the virtual absence of carbon, it is not necessary to etch back HSQ below the upper surface of the metal lines to avoid shorting. In addition, HSQ exhibits excellent planarity and is capable of gap filling interwiring spacings less than 0.15 microns employing conventional spin-on equipment. HSQ undergoes a melting phase at approximately 200° C., but does not convert to the high dielectric constant glass phase until reaching temperatures of about 400° C. for intermetal applications and about 700° C. to about 800° C.

for premetal applications. In copending application Ser. No. 08/992,430, filed on Dec. 18, 1997, a method is disclosed for selectively heating portions of a deposited HSQ layer adjoining a metal feature to increase the resistance of such adjoining portions to penetration when etching a misaligned through-hole for a borderless via.

However, HSQ is susceptible to degradation during processing leading to various problems, such as voids when forming borderless vias. For example, when forming a borderless via, a photoresist mask is deposited and a misaligned through-hole etched to expose a portion of an upper surface and a portion of a side surface of an underlying metal line, and penetrate into and expose the HSQ layer. Etching to form the through-hole is typically conducted employing reactive ion etching with fluorocarbon chemistry, e.g., $CF_4$, with an attendant polymer formation. The photoresist mask is then stripped, typically employing an oxygen ($O_2$)-containing plasma. After the photoresist mask is plasma stripped, the through-hole is conventionally cleaned employing a wet solvent, to remove polymers formed during reactive ion etching. Solvents conventionally employed include ACT935™ and ACT970™ available from Ashland Chemical Company in Pennsylvania. A further plasma stripping step is conventionally conducted after wet solvent cleaning.

During experimentation assessing the feasibility of employing HSQ for gap filling in interconnection patterns comprising a borderless via, it was found that the HSQ gap fill layer absorbs water during solvent cleaning of the misaligned through-hole. It was further found that upon subsequent filling of the through-hole, as with a barrier metal, such as titanium nitride or titanium-titanium nitride, followed by tungsten, outgassing occurs whereby voids are generated not only in the portion of the borderless via along a side surface of the lower metal feature, but throughout the borderless via. Such outgassing was also found to inhibit barrier metal adhesion resulting in undesirable interaction between tungsten hexafluoride, employed to deposit the tungsten, and the aluminum or aluminum alloy primary conductive layer of the lower metal feature.

In view of the manifest advantages of HSQ, there exists a need to provide technology whereby HSQ can be employed for voidless gap filling in forming interconnection patterns containing substantially voidless, high integrity borderless vias.

DISCLOSURE OF THE INVENTION

An object of the present invention is a method of manufacturing a high density multi-metal layer semiconductor device with design features of 0.25 microns and under, and an interconnection pattern comprising substantially voidless, high integrity borderless vias.

Additional objects, advantages and other features of the present invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device, which method comprises: forming a first dielectric layer on a substrate; forming a first patterned conductive layer, having gaps therein and comprising a first conductive feature, on the first dielectric layer; depositing a layer of hydrogen silsesquioxane (HSQ) filling the gaps; depositing a second dielectric layer on the first patterned conductive layer and on the HSQ gap fill layer; planarizing an upper surface of the second dielectric layer; forming a through-hole in the second dielectric layer exposing a portion of the upper surface and at least a portion of a side surface of the first conductive feature, and penetrating into and exposing a portion of the HSQ gap fill layer; vacuum baking; and filling the through-hole with a conductive material to form a borderless via.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
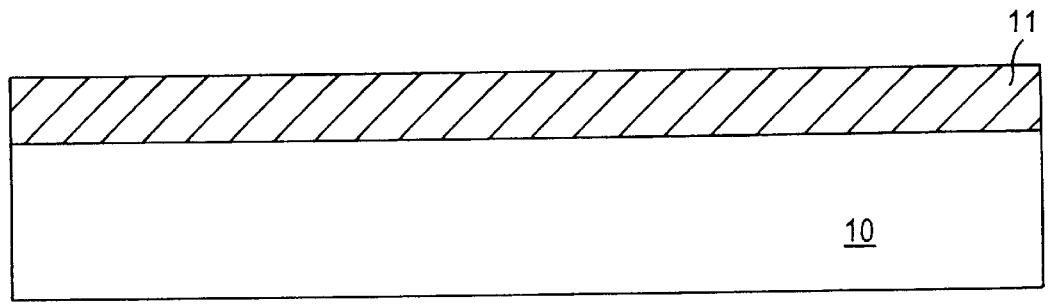
FIGS. 1 and 2 schematically illustrate conventional gap filling a patterned metal layer.
Figure 2:
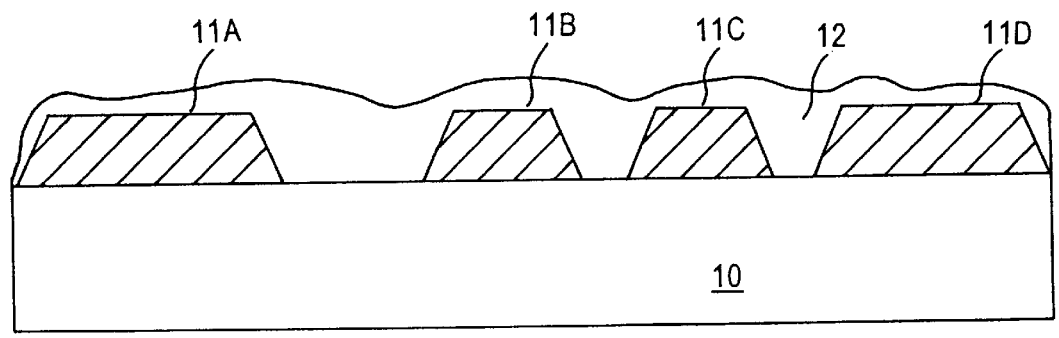
Figure 3:
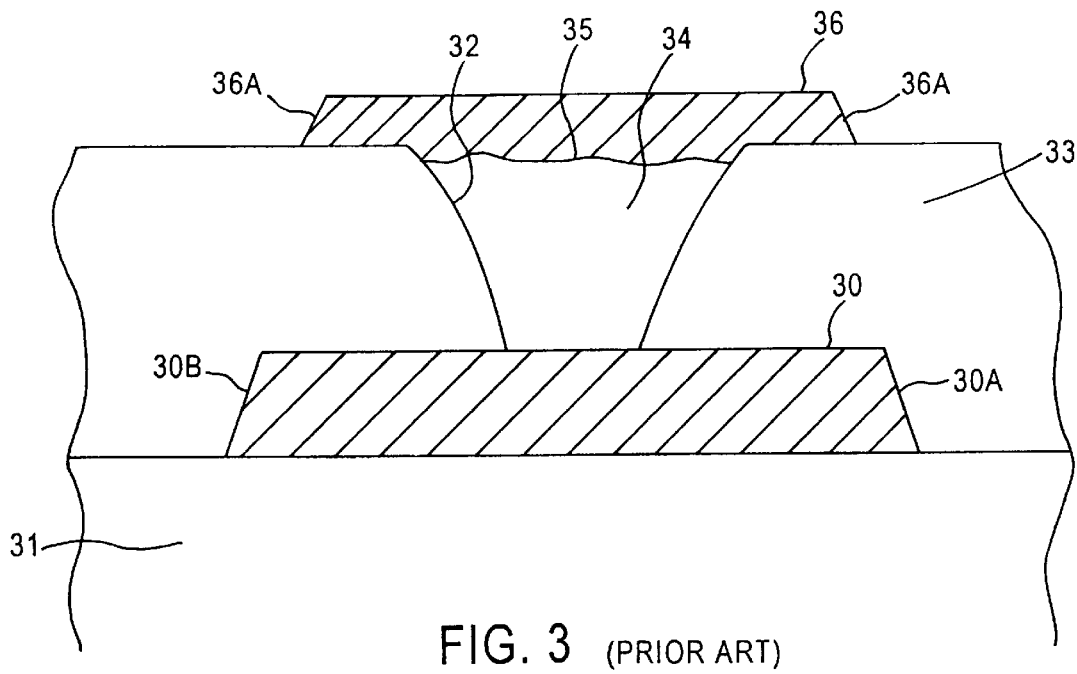
FIG. 3 schematically illustrates a conventional metal plug via interconnection.
Figure 4:
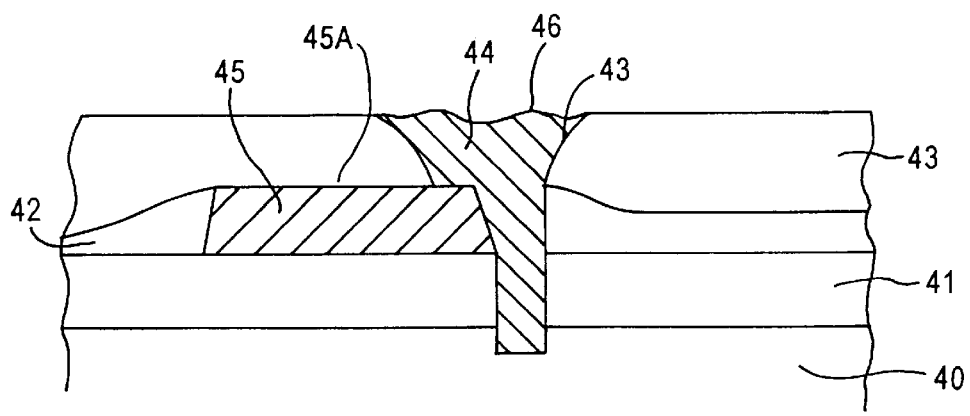
FIG. 4 schematically illustrates spiking in a borderless via.

The present invention enables the formation of substantially voidless, highly reliable borderless vias in high density, multi-metal layer semiconductor devices, including semiconductor devices having design features of 0.25 microns and under, employing HSQ to fill gaps in patterned metal layers without incurring adverse consequences stemming from outgassing of the HSQ gap fill layer when filling a misaligned through-hole with conductive material. For example, conventional practices in forming a through-hole comprise forming a photoresist mask on a dielectric layer, reactive ion etching employing a fluorocarbon chemistry to form a through-hole, removing the photoresist mask employing an $O_2$-containing plasma, wet solvent cleaning to remove polymer generated during reactive ion etching, and a subsequent plasma stripping, typically employing an $O_2$-containing plasma. During wet solvent cleaning to remove polymer generated during reactive ion etching, HSQ absorbs moisture. During subsequent filling of the through-hole to form a borderless via, as when depositing a titanium-titanium nitride barrier layer in a conventional HI-VAC sputter chamber, such absorbed moisture is outgassed, thereby creating voids and reducing device reliability. Outgassing also occurs when depositing titanium nitride by chemical vapor deposition as, for example, by the method disclosed in copending application Ser. No. 8/924,131, filed on Sep. 5, 1997.

HSQ is a highly desirable dielectric material for gap filling, in that it exhibits excellent planarity and gap filling capacity employing conventional spin-on equipment. HSQ can easily fill gaps, e.g., interwiring spacings, less than about 0.15 microns. Moreover, due to the use of a carbon-free polymer precursor, poison via problems are not encountered, and HSQ need not be etched back below the upper surface of the metal line. One form of HSQ is commercially available from Dow Corning Corp. under the product name Flowable Oxide™ or FO$_x$™.

In copending application Ser. No. 08/973,124 filed on Dec. 18, 1997 methodology is disclosed for substantially reducing or avoiding void formation during through-hole filling with conductive material by prior heat treating the as-deposited HSQ gap fill layer in inert atmosphere to outgas absorbed water prior to filling the through-hole.

In accordance with the present invention, void formation is substantially reduced or eliminated during through-hole filling with conductive material by outgassing the deposited HSQ gap fill layer in a relatively short period of time, e.g., about 45 seconds to about 2 minutes, by vacuum baking, preferably at a low pressure no greater than about $10^{-6}$ Torr, at a temperature of about 250° C. to about 400° C, e.g., greater than about 300° C. to about 400° C. Embodiments of the present invention include vacuum baking in the same tool employed for barrier metal deposition when filling the through-hole with conductive material.

Another problem generated by miniaturization relates to the RC. time constant. HSQ desirably has an as-deposited dielectric constant of about 2.9–3.0, vis-àa-vis silicon dioxide grown by thermal oxidation or chemical vapor deposition which has a dielectric constant of about 3.9–4.2. It was found that abrupt temperature changes adversely increase the dielectric constant of as-deposited HSQ. Accordingly, in an embodiment of the present invention, heat treatment to effect outgassing of absorbed water from the deposited HSQ gap fill layer is conducted in a gradual manner. In an aspect of this embodiment, the substrate, including the intermediate semiconductor device thus far fabricated, is placed into a furnace or tool preheated or maintained at a temperature of about 300° C. After the substrate has been placed in the furnace, the temperature of the furnace is elevated to the desired heat treating temperature, e.g., about 350° C. Subsequent to heat treating to outgas the deposited HSQ gap fill layer, the temperature is lowered to about 300° C. After the temperature within the furnace has been lowered to about 300° C., the substrate is removed. This procedure advantageously avoids subjecting the as-deposited HSQ gap fill layer to abrupt thermal changes, thereby minimizing any increase in its dielectric constant.

A method of forming a borderless via in accordance with an embodiment of the present invention comprises forming a first dielectric layer on a semiconductor substrate and patterning a first metal layer on the first dielectric layer to form metal features separated by gaps, such as metal lines separated by interwiring spacings. The gaps are then filled by depositing HSQ, as by spinning using conventional spinning equipment employed for SOG, at an appropriate temperature, e.g., about 200° C. HSQ is easily capable of completely voidlessly filling gaps even under 0.15 microns. A second dielectric layer is then deposited on the first patterned metal layer and HSQ layer. A through-hole is then formed in the second dielectric layer and partially penetrating into the HSQ layer exposing a portion of the upper surface and at least a portion of a side surface of the first metal layer and a portion of the HSQ layer.

The through-hole is formed by depositing a photoresist mask on the second dielectric layer and etching through the photoresist mask and a portion of the HSQ layer. Etching is typically conducted by reactive ion etching employing fluorocarbon chemistry, which results in polymer formation.

After etching the through-hole, the photoresist mask is removed in a conventional manner, as by employing an $O_2$-containing plasma. After the photoresist mask is removed, wet solvent cleaning is conducted in a conventional manner to remove polymer formed during reactive ion etching. An optional subsequent plasma stripping step can be performed to further clean the through-hole, typically employing an $O_2$-containing plasma. During wet solvent cleaning, HSQ undesirably absorbs water which leads to void formation during outgassing upon subsequently filling the through-hole with conductive material. However, in accordance with the present invention, such outgassing of the deposited HSQ gap fill layer is avoided or substantially reduced by vacuum baking after formation of the through-hole but prior to filling the through-hole with conductive material. Preferably, vacuum baking is conducted in the same tool employed for the barrier metal layer deposition and, hence, barrier metal layer deposition is performed immediately after vacuum baking. Vacuum baking is typically conducted at a pressure no greater than about $10^{-6}$ Torr at a temperature of about 250° C. to about 400° C., e.g., greater than about 300° C. to about 400° C., for relatively a short period of time of about 45 seconds to about 2 minutes.

After vacuum baking to outgas the as-deposited HSQ gap fill layer, the misaligned through-hole is then filled with a conductive material, e.g., a composite plug. Initially, a barrier layer of titanium, titanium-nitride, titanium-tungsten or titanium-titanium nitride is deposited which serves as an adhesion promoter for subsequently deposited tungsten which constitutes the primary plug material. The barrier material, e.g., titanium-titanium nitride, can be sputter deposited employing conventional sputtering equipment.

In another embodiment of the present invention, a CVD-TiN barrier layer is deposited in accordance with the methodology disclosed in copending application Ser. No. 08/924,131, filed on Sep. 5, 1997. An advantage of this embodiment is that the $H_2/N_2$ plasma treatment of the HSQ film and the $H_2/N_2$ plasma treatment of the deposited CVD-TiN film can be conducted in the same chamber.

Preferably, no wet or thermal processing is performed subsequent to vacuum baking in accordance with the present invention to outgas the as-deposited HSQ gap fill layer and before filling the misaligned through-hole with the conductive material. Embodiments of the present invention also comprise filling the through-hole with conductive material immediately after vacuum baking to outgas the as-deposited HSQ gap fill layer without the performance of any intervening processing.

Figure 5:
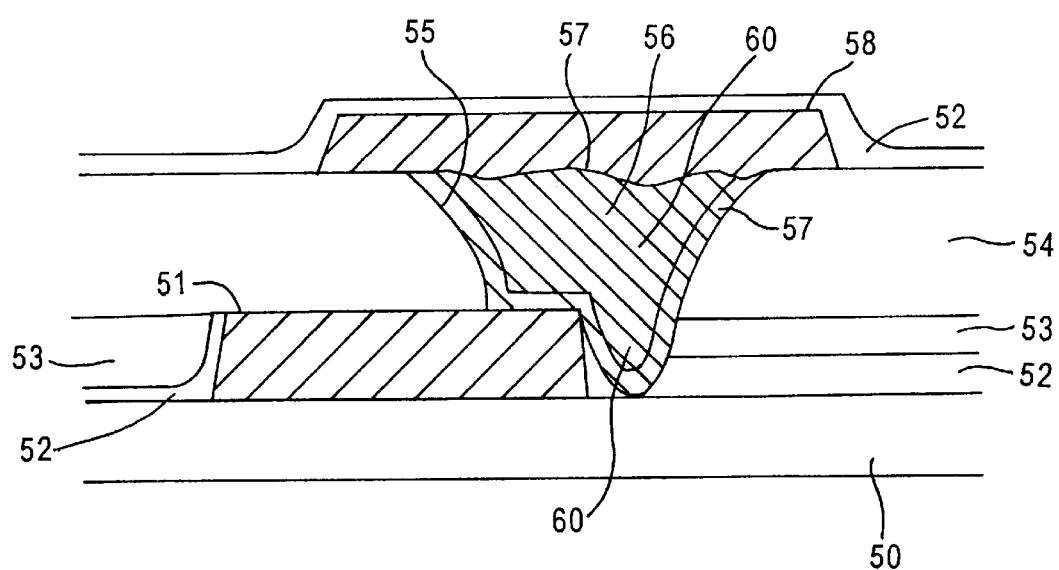
FIG. 5 schematically illustrates a borderless via formed according to the present invention.

An embodiment of the present invention is schematically illustrated in FIG. 5, wherein metal feature 51 of a patterned metal layer is formed on dielectric layer 50, with anti-reflective coating 51 thereon. Gaps between metal features are filled with HSQ 52. Optionally, an intermediate oxide 53, is deposited, such as SOG, and planarized. Second dielectric layer 54 is then deposited typically an oxide, such as silicon oxide derived from TEOS (tetraethyl orthosilicate) or silane by plasma enhanced chemical vapor deposition (PECVD), is then deposited and CMP performed. A photoresist mask is formed on the planarized upper surface of the second dielectric layer. Etching is then conducted to form misaligned through-hole 55 penetrating HSQ layer 52 and exposing a portion of a side surface of metal feature 51. Etching is conducted in a conventional manner, e.g., reactive ion etching using fluorocarbon chemistry, which results in the polymer formation. After formation of through-hole 55, the photoresist mask is stripped in a conventional manner as with an $O_2$-containing plasma. Wet solvent cleaning is then performed in a conventional manner, optionally followed by a plasma stripping step. During wet solvent cleaning, water is absorbed by the deposited gap fill layer.

In accordance with the preferred embodiment of the present invention, the substrate is placed in the same tool used for subsequent barrier metal deposition and vacuum baked. Suitable vacuum baking conditions include a low pressure no greater than about $10^{-6}$ Torr and a temperature of about 300° C. to about 400° C. for about 45 seconds to about 2 minutes, whereby the deposited HSQ gap fill layer is outgassed, giving up moisture absorbed during wet solvent cleaning of the through-hole. Preferably, the deposited HSQ gap fill layer is outgassed to give up substantially all of the moisture absorbed during wet solvent cleaning of the through-hole.

Through-hole 55 is then filled with a composite plug, as by initially depositing a barrier layer 57 which serves as an adhesion promoter for tungsten 56. The barrier layer is typically a refractory metal, such as titanium, titanium-nitride, titanium-tungsten or titanium-titanium nitride.

After forming conductive via 57, a second patterned metal layer is formed on second dielectric layer 54 and comprises metal feature 58 electrically connected to metal feature 51 through conductive via 57. The methodology is then repeated by gap filling the second patterned metal layer employing HSQ until a desired number of patterned metal layers are formed and gap filled, e.g., five metal layers. In forming borderless vias in interconnecting overlying metal features, a similar procedure is employed, i.e., the formation of the through-hole including wet solvent cleaning, the substrate is placed into the same tool employed for barrier metal layer deposition and vacuum baked to outgas the as-deposited HSQ gap fill layer to avoid formation during filling of the through-holes with conductive material.

The metal layers employed in the present invention are consistent with the conventional practices and typically comprise aluminum or an aluminum alloy. Embodiments of the present invention include forming a composite patterned metal layer comprising an initial refractory metal layer, such as tungsten, titanium or titanium nitride, an intermediate aluminum or aluminum alloy layer and an upper anti-reflective coating, such as titanium-titanium nitride. In accordance with the present invention, tungsten is deposited by conventional CVD technology.

The present invention is applicable to the production of various types of semiconductive devices, particularly high density multi-metal patterned layers with submicron features, particularly submicron features of 0.25 microns and below, exhibiting high speed characteristics and improved reliability. The present invention enables the advantageous use of HSQ to gap fill patterned metal layers without encountering a void formation problem upon filling a misaligned through-hole with a conductive material. The present invention can be easily implemented into existing production facilities is cost effective and significantly improves the integrity of borderless vias by substantially reducing or eliminating void formation during filling of a borderless via with conductive material.

In carrying out the embodiments of the present invention, the metal layers can be formed of any metal typically employed in manufacturing semiconductor devices, such as aluminum, aluminum alloys, copper, copper alloys, gold, gold alloys, silver, silver alloys, refractory metals, refractory metal alloys, and refractory metal compounds. The metal layers of the present invention can be formed by any technique conventionally employed in the manufacture of semiconductor devices. For example, the metal layers can be formed by conventional metallization techniques, such as various types of CVD processes, including low pressure chemical vapor deposition (LPCVD), and PECVD. Normally, when high melting metal point metals such as tungsten are deposited, CVD techniques are employed. Low melting point metals, such as aluminum and aluminum-base alloys, including aluminum-copper alloys, can also be deposited by melting, sputtering, or physical vapor deposition (PVD).

In the previous descriptions, numerous specific details are set forth, such as specific materials, structures, chemicals, processes, etc., in order to provide a thorough understanding of the present invention. However, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises sequentially:

forming a first dielectric layer on a substrate;

forming a first patterned conductive layer, having gaps therein and comprising a first conductive feature, on the first dielectric layer;

depositing a layer of hydrogen silsesquioxane (HSQ) filling the gaps;

depositing a second dielectric layer on the first patterned conductive layer and on the HSQ gap fill layer;

planarizing an upper surface of the second dielectric layer;

forming a through-hole in the second dielectric layer exposing a portion of the upper surface and at least a portion of a side surface of the first conductive feature, and penetrating into and exposing a portion of the HSQ gap fill layer;

vacuum baking; and filling the through-hole with a conductive material to form a borderless via.

2. The method according to claim 1, wherein conductive layer comprises a metal layer and the first conductive feature comprises a first metal feature.

3. The method according to claim 2, wherein the metal layer is a composite metal layer comprising:

a lower refractory metal layer;

an intermediate primary conductive layer comprising aluminum or an aluminum alloy; and an upper anti-reflective coating.

4. The method according to claim 2, wherein the patterned metal layer comprises a plurality of metal lines having a size no greater than about 0.25 microns, and the gaps comprise interwiring spacings.

5. The method according to claim 2, comprising:

forming a photoresist mask on the second dielectric layer;

reactive ion etching to form the through-hole;

removing the photoresist mask; and wet solvent cleaning the through-hole.

6. The method according to claim 5, comprising:

reactive ion etching with a fluorocarbon etchant;

removing the photoresist mask employing an oxygen-containing plasma;

wet solvent cleaning to remove polymer generated during reactive ion etching, wherein the HSQ layer absorbs water during wet solvent cleaning; and vacuum baking to remove water absorbed during wet solvent cleaning.

7. The method according to claim 6, comprising plasma stripping subsequent to wet solvent cleaning and prior to vacuum baking.

8. The method according to claim 6, comprising vacuum baking at a temperature of about 250° C. to about 400° C.

9. The method according to claim 8, comprising vacuum baking at a temperature greater than about 300° C. to about 400° C.

10. The method according to claim 9, comprising vacuum baking for about 45 seconds to about 2 minutes.

11. The method according to claim 4, comprising filling the through-hole with a composite conductive plug.

12. The method according to claim 11, comprising depositing a first conductive barrier layer which acts as an adhesion promoter for a second conductive layer.

13. The method according to claim 12, comprising vacuum baking in the same tool employed for barrier metal layer deposition.

14. The method according to claim 13, wherein the first conductive layer comprises titanium, titanium-nitride, titanium-tungsten or titanium-titanium nitride, and the second conductive layer comprises tungsten.

15. The method according to claim 4, wherein no intervening wet or thermal processing is performed between vacuum baking and filling the through-hole with a conductive material to form the borderless via.

16. The method according to claim 15, wherein no intervening processing is performed between vacuum baking and filling the through-hole with a conductive material to form the borderless via.

17. The method according to claim 4, comprising planarizing the second dielectric layer by chemical-mechanical polishing.

18. The method according to claim 4, wherein the second dielectric layer comprises an oxide.

19. The method according to claim 18, wherein the oxide is silicon oxide derived from tetraethyl orthosilicate or silane by plasma enhanced chemical vapor deposition.

20. The method according to claim 18, comprising depositing an intermediate oxide on the HSQ gap fill layer before depositing the second dielectric layer.

21. The method according to claim 20, comprising planarizing the intermediate oxide layer.

22. The method according to claim 4, comprising vacuum baking at a temperature of about 250° C. to about 400° C.

23. The method according to claim 4, comprising vacuum baking at a temperature of about 300° C. to about 400° C.

24. The method according to claim 23, comprising vacuum baking for about 45 seconds to about 2 minutes.

25. The method according to claim 4, comprising forming a second patterned metal layer on the second dielectric layer, wherein the second patterned metal layer comprises a second metal feature electrically connected to the first metal feature by the borderless via.

26. The method according to claim 4, comprising vacuum baking under conditions sufficient to remove water absorbed by the HSQ layer during prior processing.

27. The method according to claim 23, wherein vacuum baking comprises:

placing the substrate into a tool maintained at a temperature of about 300° C.;

elevating the tool temperature to about 350° C. to about 400° C.;

heat treating for about 45 seconds to about 2 minutes;

reducing the tool temperature to about 300° C.; and removing the substrate from the tool.

* * * * *